United States Patent [19]
Currivan et al.

[11] Patent Number: 5,416,799
[45] Date of Patent: May 16, 1995

[54] DYNAMICALLY ADAPTIVE EQUALIZER SYSTEM AND METHOD

[75] Inventors: Bruce J. Currivan, Los Altos; John E. Ohlson, Mt. View, both of Calif.

[73] Assignee: Stanford Telecommunications, Inc., Sunnyvale, Calif.

[21] Appl. No.: 926,669

[22] Filed: Aug. 10, 1992

[51] Int. Cl.$^6$ .................. H03H 7/30; H03K 5/159
[52] U.S. Cl. .................. 375/232; 364/724.2; 333/18
[58] Field of Search .................. 375/14, 15, 16, 11–13, 375/99; 364/724.2, 724.19; 333/18, 28 R

[56] References Cited

U.S. PATENT DOCUMENTS

| | | |
|---|---|---|
| 3,543,012 | 11/1970 | Courtney . |
| 3,696,235 | 10/1972 | Tufts et al. . |
| 4,323,864 | 4/1982 | Ogawa et al. . |
| 4,524,424 | 6/1985 | White . |
| 4,694,413 | 9/1987 | Arbeiter . |
| 4,771,395 | 9/1988 | Watanabe et al. . |
| 4,853,969 | 8/1989 | Weideman . |
| 4,885,787 | 12/1989 | Okamoto et al. ............... 364/724.19 |
| 5,014,232 | 5/1991 | Andre . |
| 5,224,123 | 6/1993 | Iga et al. ............... 364/724.2 |
| 5,243,624 | 9/1993 | Paik et al. ............... 375/14 |

OTHER PUBLICATIONS

Harris HSP43891, 2-Pgs., May 1991.

Primary Examiner—Stephen Chin
Assistant Examiner—Hai H. Phan
Attorney, Agent, or Firm—Jim Zegeer

[57] ABSTRACT

An adaptive filter or equalizer for digital data communication includes, a first cascade circuit connected to operate as a digital finite impulse response (FIR) filter, the first cascade circuit having a first plurality of input taps for application of filter weighting signals thereto, a single input for samples of input data, and an output for filtered data. A second cascade circuit, which has the inverse canonical form, has a second plurality of input taps for receiving signal samples of input data, a single input for receiving error signals, and an output for yielding a succession of weighting signals. A sequencing circuit applies data signals to successive cascade stages of the second cascade circuit in a time sequence which is the reverse of that of the weight signals applied to the plurality of input taps of the first cascade circuit, such that the second cascade circuit functions as a weighting signal generator for the first cascade circuit. Storage registers at the inputs of the first and second cascade circuits are updated by weight and data signals, respectively, serve to multiplex application of single inputs to multiple cascade stages. An error signal is derived from the output of said first cascade circuit and applied to the error input of the second cascade circuit.

4 Claims, 5 Drawing Sheets

DYNAMICALLY ADAPTIVE EQUALIZER SYSTEM AND METHOD

BACKGROUND OF THE INVENTION:

This invention relates to the design and circuit implementation of adaptive equalizers, which are used in modern electrical communication to equalize (i.e., compensate for) linear amplitude and phase distortions which occur naturally within the useful frequency band of practical transmission circuits. If these distortions are compensated, as is well known in the art, a given circuit is capable of correctly received transmission of information at substantially higher rates and over virtually unlimited transmission distances.

In particular, the invention relates to dynamically adaptive equalizers, which employ the signals transmitted through a communication circuit or channel for measurement of its distortion. Such circuits alter their amplitude and phase characteristics with time to minimize the measured error at the receiving end of the circuit. Adaptive equalizers are required for use in connection with circuits whose distortion properties are unknown at the time of initiation of transmission, or which for any reason may change during transmission. Representative circuits include those having variable multiple paths, radio transmissions carrying digital voice, data and other signals, and switched telephone lines. In typical adaptive equalizer operation, communication may be established using a repeated signal carrying no information. The equalizer adjusts rapidly to compensate for the transmission circuit distortion. After information transmission is begun, the information signals are then used continuously for iterative dynamic correction of the filter characteristics.

More specifically, this invention relates to adaptive equalizers implemented using digital sampling and computation processes to effect equalization of transmission lines, or to remove signal distortion due to variable and multiple paths, in radio transmissions carrying digital voice, data and other signals.

RELATED ART STATEMENT

Digitally operating adaptive equalizers are well known in the electrical communications art. All equalizers are, in their basis, electrical filters, and adaptive equalizers are based on electrically adaptable filters, typically taking the form of finite impulse response filters, some forms of which are described in Watanabe, U.S. Pat. No. 4,771,395, Sep. 13, 1988.

In addition to an dynamically adaptable electrical filter, an adaptive equalizer requires a means to produce the series of control inputs (termed "weights") which define the filtered output in time when responding to a single input pulse of known amplitude. This means is conventionally referred to as a weight generator, and its outputs as weights, though they are actually measures of the filter's response to a pulse input at evenly spaced time intervals.

The weight generator, in turn, uses as its input an error signal which is derived by comparing the output of the filter with expected value(s) of the output. Since these circuits are used in digital data transmission, the desired output signals have a very limited number of values.

Some prior art adaptive equalizers use identical circuits for the FIR filter and weight generator (WG) functions. In contrast to this prior art, the present invention uses the inverse canonical structure as a weight generator. As an example of an earlier adaptive equalizer, the Mobile Link ½ Receiver Program (MLRP) receiver, a product of the assignee hereof, uses the zoran 891 FIR filter chip for both the FIR and WG functions of its adaptive equalizer. Others are also believed to be using Zoran for both FIR and WG as applied to adaptive equalizers. The Zoran chip is second-sourced by Harris as the HSP43891.

White, U.S. Pat. No. 4,524,424 describes one configuration wherein a Transversal Filter (of which a finite impulse response filter is a particular example) derives weight signals as a set of parallel outputs from a Tap Weight Computer comprising multipliers, integrators, and time delays. Typical of such prior-art adaptive equalizers, White's invention incorporates a multiplicity of electrical connections between the weight generator and the filter, each transferring a weight signal to one cascade stage of the filter.

BRIEF DESCRIPTION OF THE INVENTION

An object of the present invention is to provide an adaptive digital filter (equalizer) whose design makes use of similar circuits for the digital elements of the greatest complexity, i.e. the filter and the inverse canonical structure as the weight generator. The practical benefits are reduced design time and reduced production cost for the equalizer. These benefits apply to adaptive filters having both filter and weight generator on a single semiconductor chip, as well as to ones in which filter and weight generator comprise separate chips or collections of chips and other components.

Another object of the invention is to minimize the number of additional integrated circuits required ("glue chips") to construct a family of adaptive equalizers from a multiplicity of integrated circuits of the same design.

Still another object of the invention is to employ a weight generator circuit having a single output to drive multiple weighting inputs of the adaptive filter.

Yet another object of the invention is to employ low-cost integrated digital circuits capable of operation at significantly higher speeds than are required to handle information signals, and through multiplex use of their outputs achieve significant reduction in cost and complexity of an adaptive filter for those information signals.

These objects are realized, in one embodiment of our invention, through novel circuits incorporating commercially available integrated digital circuits. In another embodiment, they are realized through large-scale integrated circuits which incorporate identical subcircuits for weight generator and adaptive filter functions.

An adaptive filter or equalizer according to this invention includes a first cascade circuit which may be configured in the inverse canonical form (see FIG. 1) connected to operate as a digital finite impulse response filter, the first cascade circuit having a first plurality of input taps for application of filter weighting signals thereto, a single input for samples of input data, and an output for filtered data. A second cascade circuit, which is configured in the inverse canonical form (see FIG. 1) and having a second plurality of input taps for receiving signal samples of input data, a single input for receiving error signals, and an output for yielding a succession of weighting signals. A sequencing circuit applies data signals to successive cascade stages of the second cascade circuit in a time sequence which is the reverse of that of the weight signals applied to the plurality of input taps of the first cascade circuit, such that the second cascade circuit functions as a weighting signal generator for the first cascade circuit. Storage registers at the inputs of the first and second cascade circuits are updated by weight and data signals, respectively, serve to multiplex application of single inputs to multiple cascade stages. An error signal is derived from the output of said first cascade circuit and applied to the error input of the second cascade circuit.

BRIEF DESCRIPTION OF THE DRAWINGS

The above and other objects, advantages and features of the invention will become more clear when considered with the following specification and accompanying drawings wherein.

DESCRIPTION OF THE PREFERRED EMBODIMENTS

Figure 1:
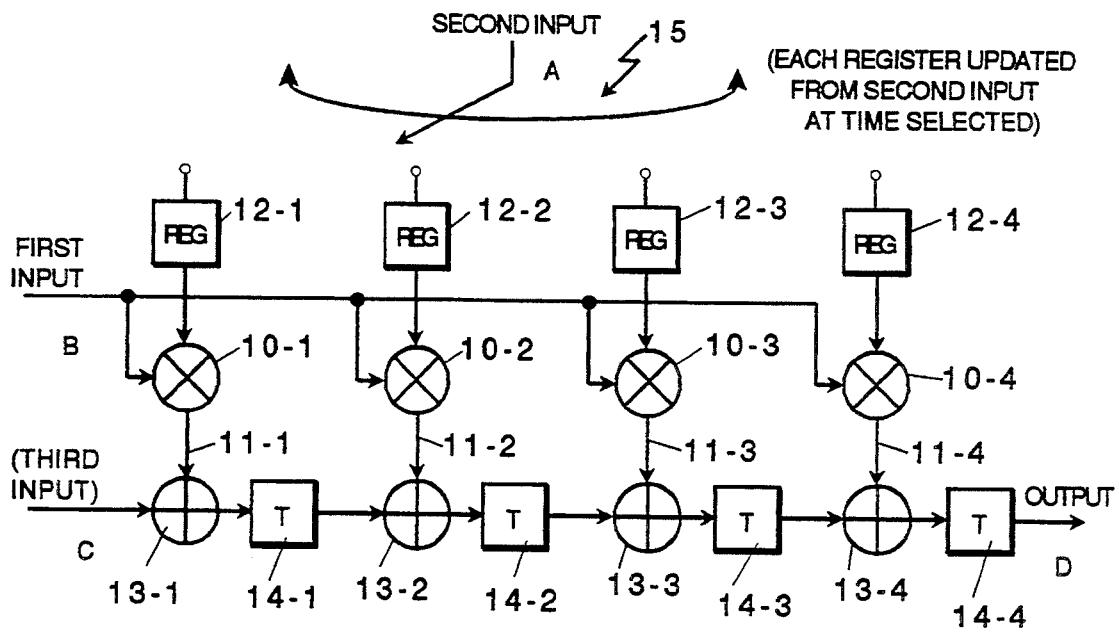
FIG. 1 depicts a representative form of the configurable circuit used as a common basis for the filter and associated weight generator, called "inverse canonical form"

The inverse canonical form of a FIR filter is defined by the structure in FIG. 1, not including the input switch 15. It consists of a group of N taps. (N may be any integer greater than or equal to 1; in the example of FIG. 1, N=4). Each tap (for example, the leftmost tap in FIG. 1) consists of a multiplier 10-1, an adder 13-1, a tap delay element 14-1, and a coefficient register 12-1. The plurality of N taps is cascaded as shown in FIG. 1.

At each clock time, processing occurs in a given tap in the following sequence:
  i. The content of the coefficient register is multiplied by the first input B.
  ii. The resulting product is added to the left-hand input of the adder. (In the case of the leftmost tap, the left-hand input is the third input C; in the case of the other taps, the left-hand input is the current content of the tap delay element of the neighboring tap to the left.)
  iii. The content of the tap delay element is replaced with the output of the adder.

In addition, FIG. 1 contains an input switch 15 whose purpose is to apply data to the coefficient registers. On each clock, the switch wiper advances by one tap in its assigned direction (which may be left or right, depending on the mode of operation). When the wiper addresses a given coefficient register, the content of that coefficient register is updated with new information from the second input. The coefficient registers not being addressed hold their previous values. In this manner one coefficient register is updated per clock, and after every period of N clocks all of the coefficient registers have received an update.

FIG. 1 depicts a single electronic circuit suited for either filter or weight generator application. Although the example shown includes N=four cascaded stages, it should be understood that any suitable multiplicity of stages could be used. All signals in FIGS. 1–6 are complex numbers, consisting of a real part and an imaginary part.

The central elements of the circuit include a plurality of digital multipliers 10-1, 10-2, 10-3, 10-4, whose outputs 11-1, 11-2, 11-3, 11-4, are complex products of a first signal input B and a set of complex numeric values derived from a like plurality of storage registers 12-1, 12-2, 12-3, 12-4. The multipliers may be implemented in a variety of ways, for example using either fully parallel-by-digit binary operation (equivalent to look-up in a multiplication table stored in read-only memory), serial bit-by-bit multiplication, or any other logically correct signed integer multiplication logic. The product generated by each multiplier forms one input to a complex digital adder 13-1, 13-2, 13-3 and 13-4, whose other input is derived from the adder to its left, but delayed one clock cycle by a conventional delay circuits 14-1, 14-2, 14-3 and 14-4, shown as T. The delayed output of the right-most adder 13-4 forms the output of the circuit.

A common application of such filters is to detection of phase- and amplitude-modulated signals. In this case, each of the inputs and weight values shown is a time series of pairs of values, one representing the in-phase or real component (I) and the other the quadrature or imaginary component (Q) of the complex baseband representation of a signal. Hence, each register in fact comprises a pair of registers (one for the I and the other for the Q value). Likewise the adder comprises two adders and the multiplier comprises four multipliers plus two adders, to correctly combine the in-phase and quadrature terms. The technique works equally well with real number valued signals.

Digital numeric values stored in registers 12-1, 12-2, 12-3, 12-4, are derived from an electronic switch 15, shown schematically in the figures. The electronic switch connects input A to one of the storage registers 12-1 ... 12-4 during each clock cycle, at which time input A updates the value stored in that register. Between clock pulses, the switch 15 advances to left or right one register. After advancing to the left or right end of the series of registers, the switch next moves to the register at the opposite end to continue its cycle. The direction of advance of switch 15 is arranged to be statically configured, as for example by application of a voltage to a controlling terminal or by multiplexer logic circuits (not shown).

It is to be understood that each storage register 12-1 ... 12-4, may be designed to store a complex number having up to some selected number of binary digits, and that multipliers 10-1 ... 10-4 and adders 13-1 ... 13-4 are designed to deal with corresponding numbers of binary digits. As an example, the complex multipliers 10-1 ... 10-4 might each consists of four real multipliers, with each real multiplier designed to combine pairs of 8-bit inputs into 16-bit products, and adders 13-1 ... 13-4 to hold output values with up to 20 bits for each part (real and imaginary).

Figure 2A:
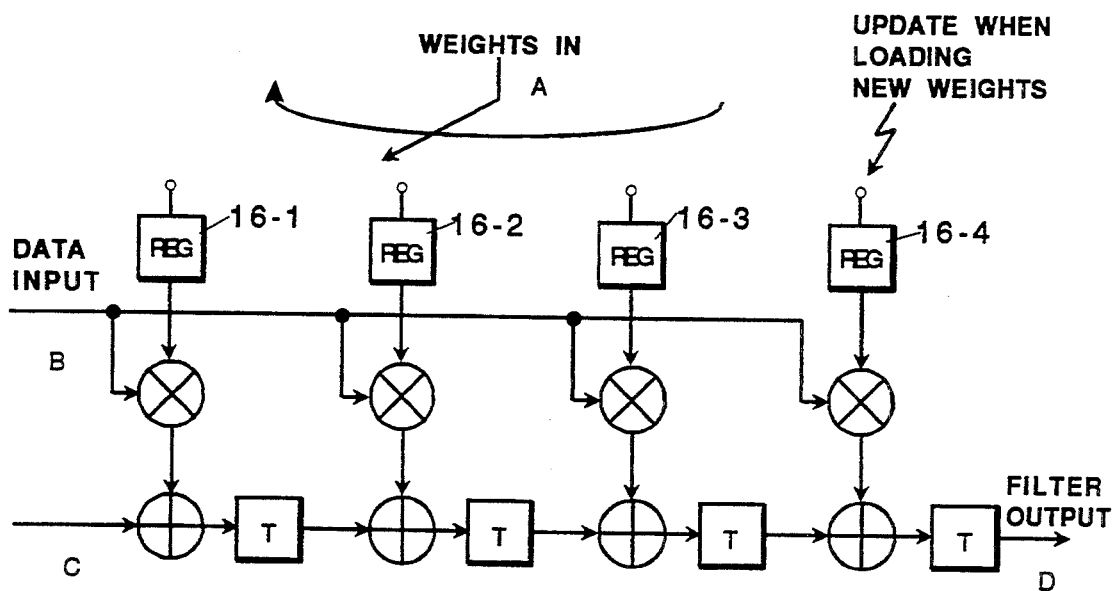
FIG. 2a depicts an adaptive filter configuration of the circuit shown in FIG. 1.
Figure 2B:
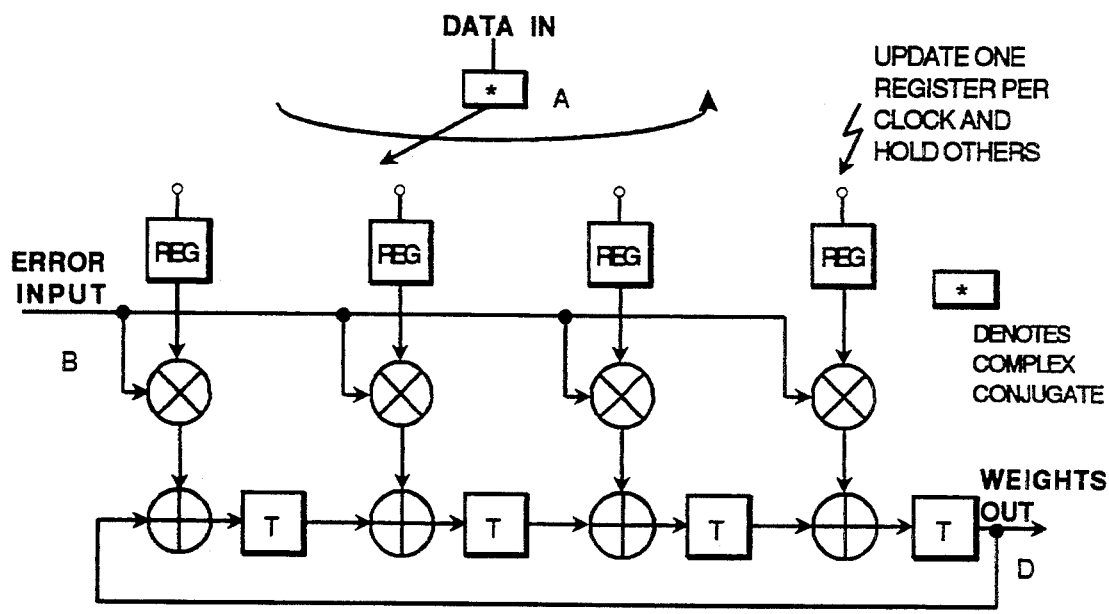
FIG. 2b depicts a weight generator configuration of the circuit shown in FIG. 1.
Figure 4:
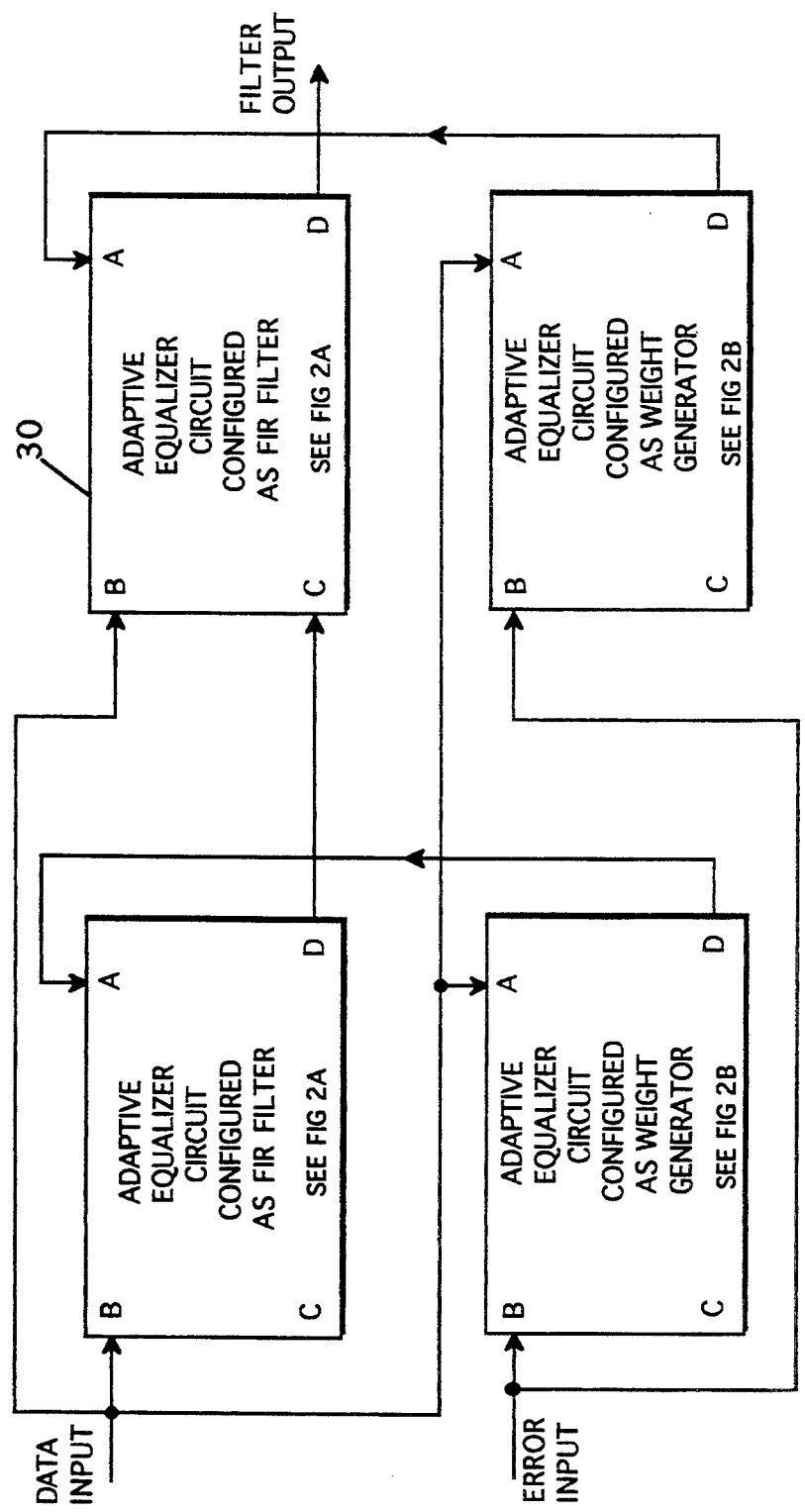
FIG. 4 depicts interconnection of two pairs of the same circuits to form an adaptive equalizer with doubled number of filter elements, FIG. 5 displays results of a computer simulation of the operation of our invention.

Input C is used when the circuit is connected to another to extend the number of filter taps, as in the example depicted in FIG. 4, and when the circuit is used as a weight generator, as shown in FIG. 2b.

Conventional digital clock pulses, generated in a circuit external to those shown, are used to control and sequence the circuit's operations. Although by the convention used in the diagrams, for clarity of disclosure, no clock input is shown, each storage register in the circuit receives common clock pulses. Likewise, each part of the circuit is energized by electric power, supplied by an external power supply which is omitted in the diagram convention used for clarity of disclosure.

In the FIR filter configuration of FIG. 2a, the signal input B comprises the input data signal, a succession of complex integer digital values, which may for example be derived by sampling an analog input signal for each clock pulse. The second input A, in this case, is a sequence of weighting values, which update the value in each register 16-1, 16-2, 16-3 and 16-4 in turn, sequencing to the left in this configuration. This circuit thus carries out correctly the function of a FIR filter, whose output $y_n$ at time sample (i.e., clock pulse) n, is given by $$y_n = \sum_{i=0}^{n-i} w_i x_{n-i}$$

where
$x_n$=filter input at time sample n
$Y_n$=filter output at time sample n
$w_i$=ith tap weight {i=0,1,2, . . . ,N−1}
N=number of tap weights (e.g. 4 in the example depicted)

Each of the values $x_n$, $y_n$, and $w_i$ comprises inphase and quadrature components, which are combined according to rules of combination of complex numbers. In particular, the in-phase component of a sum is the sum of the in-phase components, and likewise for the quadrature components. The in-phase component of a product is the product of the in-phase components less the product of the quadrature components. The quadrature component of a product is the product of the first in-phase and second quadrature components, plus the product of the second in-phase and first quadrature components.

FIG. 2b illustrates the same circuit, here configured to operate as a weight generator for use in an adaptive filter. The plurality of input taps of the second cascade circuit receive the complex conjugated signal samples of the input data. Configuration for this application requires that the second input, used to update the registers REG, be switched in left-to-right sequence, so that each of the N weights is correctly updated by the error signal. In addition, the output of the adder chain is fed back to its input C, in this case. The correct increments (differences from the weight value at the previous sample time) for weight generator outputs at sample time n are products of the detected error at time sample n and the conjugated input data values at samples n, n+1, . . . , n+N−1, as given by the expression $$\Delta w_{i,n} = e_n x_{n-i}^*$$

where $\Delta w_{i,n}$=increment of ith tap weight {i=0,1,2, . . . ,N−1} at sample time n
*=denotes complex conjugate operation
$e_n$=error input at sample time n
$x_n$=data input at sample time n This equation shows that the weight increment at each tap differs from the weight increments at the other taps primarily in the delay i that is applied between the error sequence and the conjugated data sequence. The weights are constantly circulating in a clockwise direction around the feedback loop formed by connecting the output D to the third input C as shown in FIG. 2b. As each weight moves to the right through the tap delay registers marked "T" in FIG. 2b, it is incremented by the product of the current error signal and the conjugated data residing in the data register marked "REG" in FIG. 2b. In order to maintain the correct delay between error and conjugate data for a given weight, the switch wiper at the top of FIG. 2b must move in the same direction as the weights, that is, left to right.

As each weight circulates, it appears periodically at the output D, at which time it is available for application to the FIR filter as an updated weight. Since the switch wiper in FIG. 2b is progressing in the same direction as the input conjugate data, weights corresponding to less delay between error and data are output first, while weights corresponding to greater delay between error and data are output last.

In the FIR structure of FIG. 2a, the tap delay register at the right 16-4 corresponds to the input data with least (one unit time T) delay from input to output, and the tap delay register at the left 16-1 corresponds to the input data with greatest (four unit times T) delay from input to output. In applying the updated weights to the FIR filter, the weight corresponding to least delay between error and data (the first weight output from the weight generator) is applied to the FIR filter tap with least delay from input to output (the rightmost tap 16-4). Similarly, the weight corresponding to the greatest delay between error and data (the last weight output from the weight generator) is applied to the FIR filter tap with the greatest delay from input to output (the leftmost tap 16-1). Thus in the FIR filter the switch wiper in FIG. 2a moves from right to left, which is opposite the direction of motion of the switch wiper in the weight generator, FIG. 2b. The incremental tap weight values are combined with the sum of previous increments by the adders, such that the output tap weight for tap i at time sample n is given by $$w_{i,n} = \sum_{k=0}^{n} e_k x^*_{k-i}$$

An essential part of the configuration of the weight generator circuit is the connection of its output D internally or externally, as shown in FIG. 2b, back to its input C. Thence the weights circulate through the shift register formed by the adders and delays T, and are incrementally updated continually, in that process.

Figure 3:
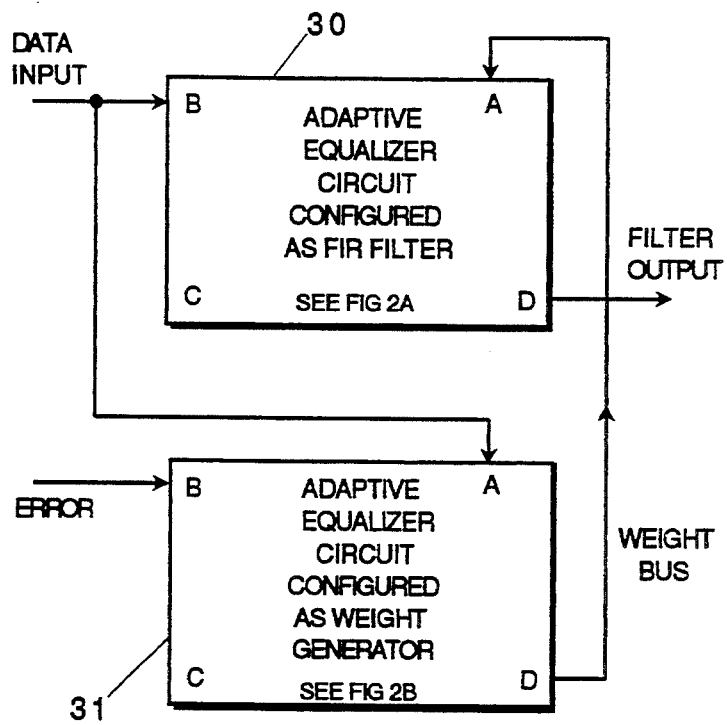
FIG. 3 depicts the interconnection of the circuits of FIGS. 2a and 2b to form an adaptive equalizer.

FIG. 3 depicts the connection of the circuits of FIGS. 2a and 2b to form an adaptive equalizer incorporating the invention by connecting the weight output (D) of the weight generator configured circuit to input A of the filter-configured circuit. The data samples enter input B of the FIR filter 30, are filtered using the latest set of weights, and then output on port D. The weights are loaded into input A of the FIR filter at a rate of one weight per clock. Input C of the FIR ASIC is tied off to zero. The data samples also enter input A of weight generator 31 (they are conjugated internally) and are correlated with the error on input B to produce updated weights which exit the weight generator 31 on port D.

Port D of the weight generator is also then tied around to input C internally for the weight accumulation function. The error generation and other auxiliary functions are performed externally. Data input and error are derived from signal detection circuits in a conventional manner.

FIG. 4 depicts the connection of four of the same circuits to form an adaptive equalizer having double the number of taps as that in FIG. 3. In this case, the output D of the FIR circuit is connected to the C input of the corresponding circuit on the right. Cascading in a like manner can occur for any length. The data input is applied to the rightmost WG circuit without added delay. Each WG circuit cascaded leftward receives its data input delayed by 4 additional clocks indicated in the left WG by TD. The delay is shown as done internally for the embodiment shown. It could be external and applied between the data input bus and input A.

Figure 5:
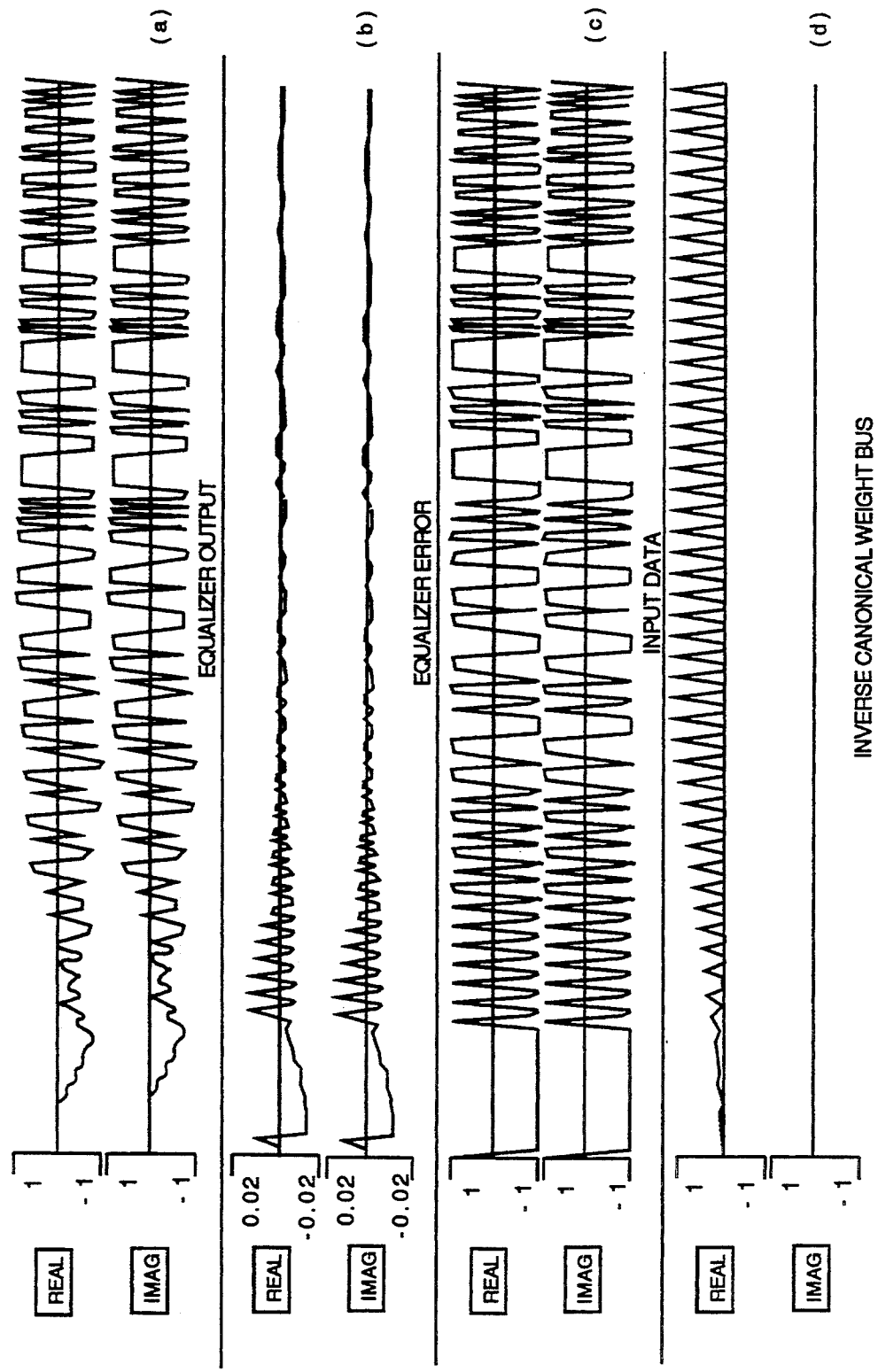

FIG. 5 reproduces outputs of a computer simulation which displays (c) Input data, (b) Equalizer error, (a) Equalizer output and (d) weight signals, characterized in the simulation as Inverse canonical weight bus signals. The significant aspect of the traces generated by the computer simulation is that the output (a), after a necessary period of automatic and dynamic adjustment of the weighting values, becomes essentially identical to the input (c) except for a delay. The error values (b), initially large, reduce after the adjustment period to near zero. The weight-bus data shown, when applied to the weight values stored in the registers REG of the FIR filter-configured circuit(s), represent a situation in which a single weight attains a high value (the equivalent of unity) while all others remain near zero.

Figure 6:
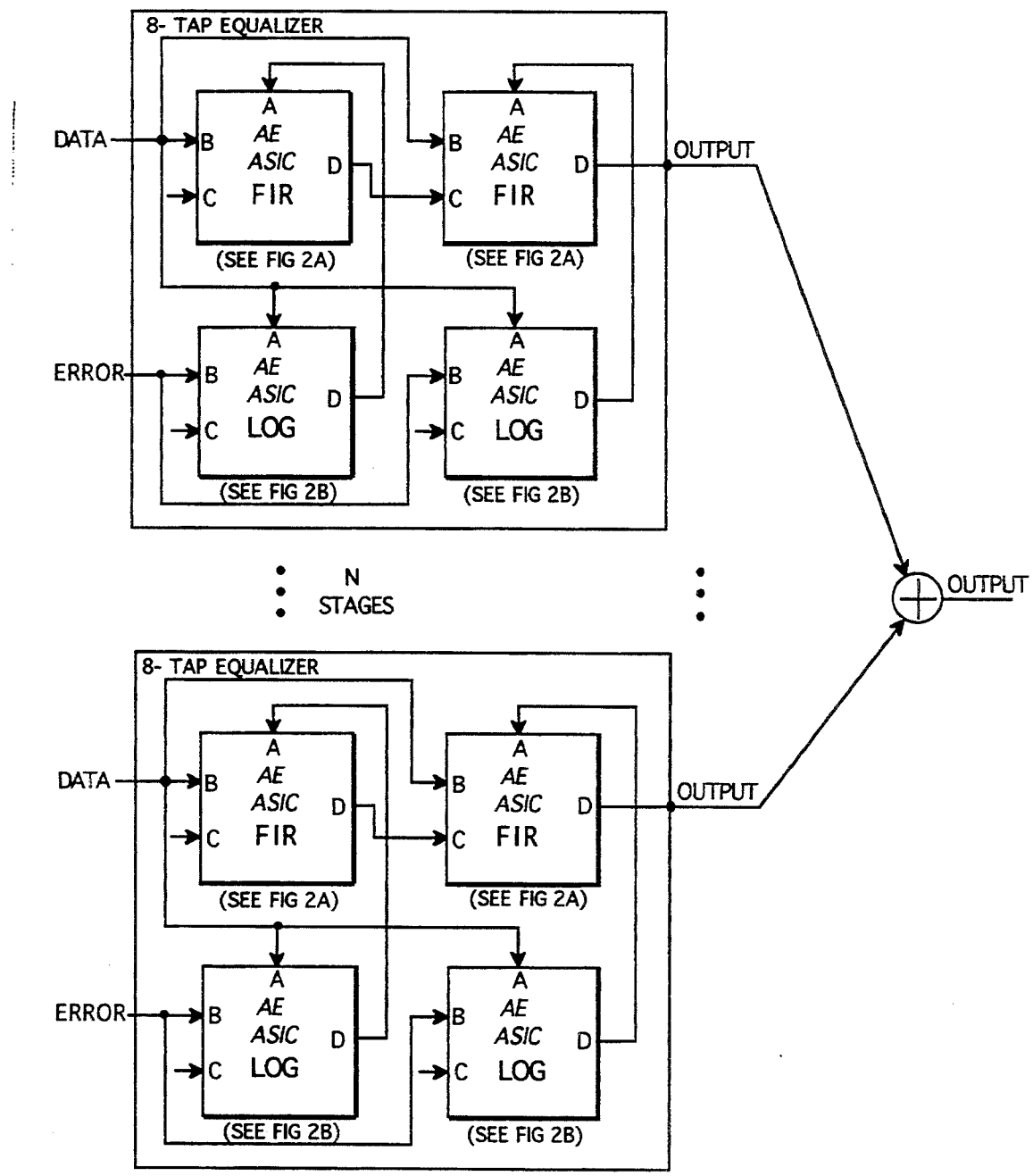
FIG. 6 illustrates an implementation of the invention with 16T/2 spaced taps and N/2 diversity channels using 4N equalizer units.

FIG. 6 shows an array of finite impulse response (FIR) filters constituted by application specific integrated circuit (ASIC) chips, and weight generators WG also in ASICs cascaded in the following dimensions:

Number of taps: 16
Number of samples per symbol T/2
Number of diversity channels N/2

This demonstrates expandability of the system in various dimensions.

While the description above describes a particular class of applications, the invention is applicable to any adaptive filter, equalizer or other electrical filter application in which the uncorrupted and undistorted signal has a format from which can be derived an error signal whose reduction to zero represents the removal of corruption and distortion.

What is claimed is:

1. An adaptive equalizer comprising:
   a first cascade circuit connected to operate as a digital finite impulse response filter, said first cascade circuit having a first plurality of input taps for receiving filter weighting signals, a single input for receiving samples of complex input data, and an output for producing filtered data;
   a source of error signals, coupled to receive said filtered data, for generating error signals,
   a second cascade circuit, said second cascade circuit being in the inverse canonical form with respect to said first cascade circuit and having a second plurality of input taps for receiving complex conjugate samples of said input data, a single input for receiving error signals from said source of error signals, and an output for yielding a succession of weighting signals;
   sequencing circuit means for applying complex conjugate samples of said input data to said second plurality of input taps of said second cascade circuit in a time sequence which is the reverse of that of the weight signals applied to the first plurality input taps of said first cascade circuit, such that said second cascade circuit functions as a weighting signal generator for said first cascade circuit, and
   switch means connecting the succession of weighting signals from said second cascade circuit to successive ones of said first plurality of input taps.

2. The adaptive equalizer defined in claim 1 further including a first set of storage registers connected to said first plurality of input taps and a second set of storage registers connected to said second plurality of input taps for storing filter weighting signals and complex conjugate samples, respectively, the stored filter weighting signals and complex conjugate samples being updated by the weighting signals and complex conjugate samples of said input data, respectively.

3. An equalization process to compensate for amplitude and phase distortions in a digital communication channel, comprising:
   providing a first cascade circuit connected to operate as a digital finite impulse response filter, said first cascade circuit having a first plurality of input taps for receiving filter weighting signals, a single input for receiving samples of complex input data, and an output for producing filtered data; providing error signal from said filtered data,
   providing a second cascade circuit, said second circuit having the inverse canonical structure with respect to said first cascade circuit and having a second plurality of input taps for receiving complex conjugate samples of input data, a single input for receiving the error signals, and an output for yielding a succession of weighting signals; and
   applying complex conjugate samples of said input data to said second plurality of input taps of said second cascade circuit in a time sequence which is the reverse of that of the weight signals applied to the first plurality of input taps of said first cascade circuit, such that said second cascade circuit functions as a weighting signal generator for said first cascade circuit.

4. The equalization process defined in claim 3 further including providing storage registers at said input taps of the first and second cascade circuits for storing filter weighting signals and complex conjugate samples, updating the stored filter weighting signals and complex conjugate samples in said storage registers by weights and complex conjugate samples of said input data respectively.

* * * * *